US006326854B1

(12) United States Patent
Nicholls et al.

(10) Patent No.: US 6,326,854 B1
(45) Date of Patent: Dec. 4, 2001

(54) COAXIAL RESONATOR AND OSCILLATION CIRCUITS FEATURING COAXIAL RESONATORS

(75) Inventors: Charles Tremlett Nicholls, Nepean; Johan M. Grundlingh, Kinburn, both of (CA)

(73) Assignee: Nortel Networks Limited, Montreal (CA)

( * ) Notice: Subject to any disclaimer, the term of this patent is extended or adjusted under 35 U.S.C. 154(b) by 0 days.

(21) Appl. No.: 09/409,989

(22) Filed: Sep. 30, 1999

(51) Int. Cl.[7] .............................. H01P 7/04; H01P 7/10; H03B 5/18; H03B 7/14; H03L 7/099
(52) U.S. Cl. ............................. 331/56; 331/34; 331/102; 331/114; 331/115; 331/117 D; 331/177 V; 333/206; 333/219.1; 333/222
(58) Field of Search .................................. 331/34, 56, 96, 331/117 D, 177 V, 101, 102, 114, 115; 333/206, 219.1, 222

(56) References Cited

U.S. PATENT DOCUMENTS

| 4,223,287 | * | 9/1980 | Nishikawa et al. | 333/207 |
| 4,398,164 | * | 8/1983 | Nishikawa et al. | 333/222 |
| 4,636,759 | * | 1/1987 | Ishikawa et al. | 333/223 |
| 5,025,229 |   | 6/1991 | Hasegawa et al. | 331/107 A |

(List continued on next page.)

FOREIGN PATENT DOCUMENTS

| 43 23 365 A1 | 1/1995 | (DE) | H01P/7/04 |
| 0 527 470 A1 | 2/1993 | (EP) | H03B/5/18 |

OTHER PUBLICATIONS

Joo–Yeol Lee and Ui–Seok Hong, Electronic Letters: Push–push subharmonically injection–locked oscillator, 1996, 1792–1793.

California Eastern Laboratories, AN1034, Designing VCO's and Buffers Using the UPA family of Dual Transistors, 1996, 1–8.

Siemens Matsushita Components, Ceramic Coastal Resonators, downloaded from web page www.epco.com/inf/60/lm/d0000001.pdf on or before Sep. 24, 1999, 2–9.

Integrated Microwave, Coaxial Resonators, downloaded from web page www.imesd.com/coaxreso.html on or before Sep. 24, 1999, 1–4.

Suraez, Jose, "Balanced VCO with Ring Resonator", Motorola Inc., Technical Developments, vol. 13, p. 90, Jul. 13, 1991.

Kuchler, Gundolf, "Coaxial Ceramic Resonators for UHF and Microwaves", Siemens Components XXIV, No. 6, pp. 223–227, Dec. 24, 1989.

Primary Examiner—Siegfried H. Grimm
(74) Attorney, Agent, or Firm—Dennis R. Haszko (57) ABSTRACT

There is a manufacturing limit on how small ceramic coaxial resonators can be produced, which leads to a limit on the frequency of resonance for these resonators. One technique to double the effective frequency of a ceramic coaxial resonator is to couple each end of a resonator to a Colpitts oscillator, the oscillators being balanced and out-of-phase by 180°. During operation, the resonator is effectively divided in half with a virtual ground forming in the center. This allows a single resonator to operate as two resonators of half the original size. Hence, the oscillation frequency for each of these balanced oscillators is doubled when compared to the frequency of similar oscillators that have separate ceramic coaxial resonators of similar size. This technique expands the range of use for a ceramic coaxial resonator so that, if implemented within a push-push architecture and if used along side a subharmonically pumped mixer that allows for doubling of the local oscillator frequency, the maximum oscillation frequency is increased to 40 GHz. This frequency range allows ceramic coaxial resonators to be used for high frequency applications such as LMDS.

29 Claims, 9 Drawing Sheets

U.S. PATENT DOCUMENTS

| | | | |
|---|---|---|---|
| 5,132,651 | * | 7/1992 | Ishikawa et al. ................... 333/202 |
| 5,175,520 | * | 12/1992 | Inoue ................................. 333/222 |
| 5,327,110 | | 7/1994 | Block ................................ 333/222 |
| 5,399,997 | | 3/1995 | Yoshida ............................ 331/158 |
| 5,508,665 | * | 4/1996 | Chan et al. ....................... 331/101 |
| 5,613,231 | * | 3/1997 | Morey ........................ 331/107 DP |
| 5,859,572 | * | 1/1999 | Hill .................................... 331/114 |

* cited by examiner

COAXIAL RESONATOR AND OSCILLATION CIRCUITS FEATURING COAXIAL RESONATORS

FIELD OF THE INVENTION

This invention relates generally to coaxial resonators and more specifically to modifications within coaxial resonator oscillation circuit designs.

BACKGROUND OF THE INVENTION

Oscillators are required within many different technology areas, especially within the expanding communication industry. In communication applications, oscillators are commonly used to generate carrier signals at specific frequencies on which information signals are subsequently modulated. For instance, a Voltage Controlled Oscillator (VCO) within a Personal Communication System (PCS) would typically be tuned around 1900 MHz.

Figure 1:
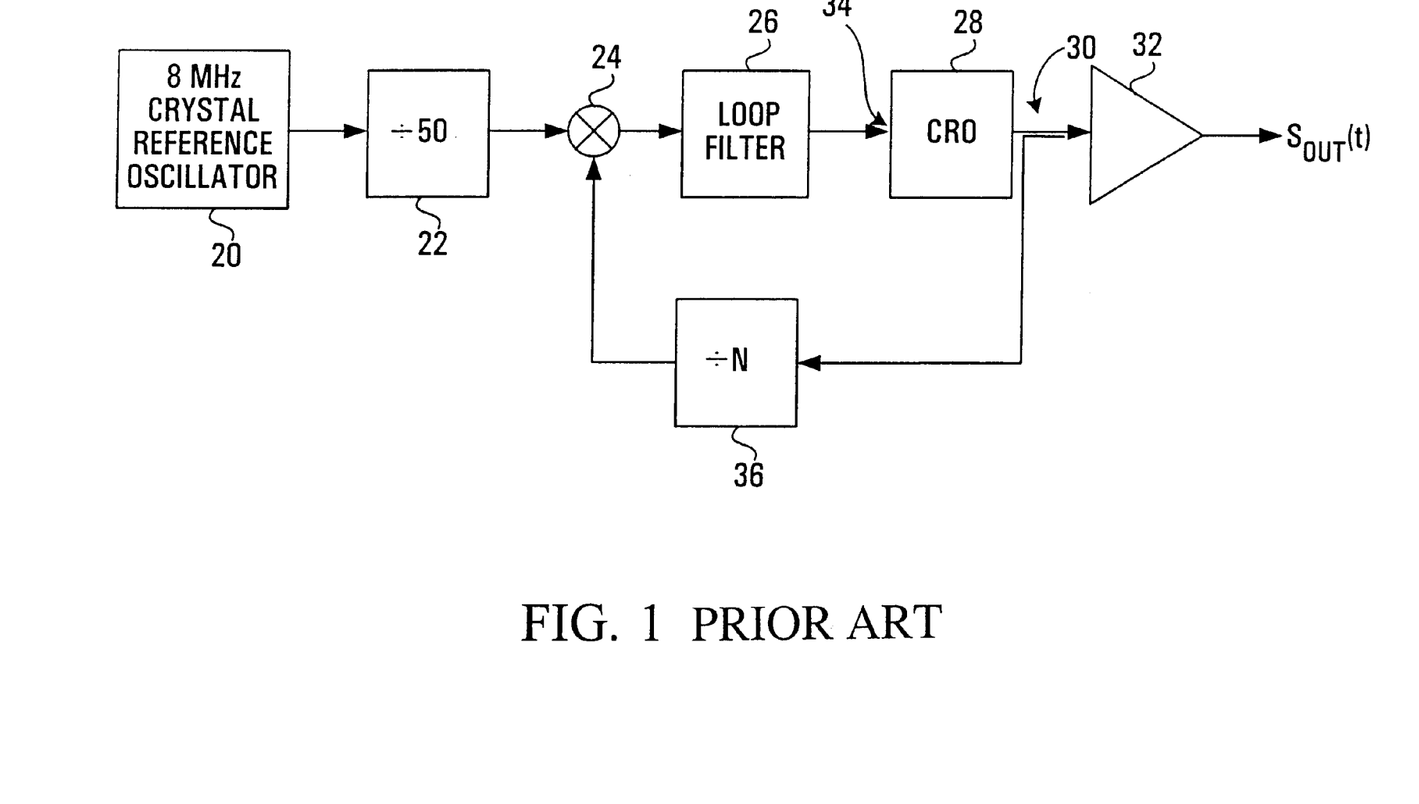
FIG. 1 is a block diagram illustrating a well-known Phase Locked Loop-Frequency Synthesizer (PLL-FS) configuration.

FIG. 1 illustrates a typical Phase Locked Loop-Frequency Synthesizer (PLL-FS) that is a standard implementation for a VCO within a communication apparatus. In the case shown in FIG. 1, the PLL-FS includes a crystal reference oscillator 20, in this case operating at 8 MHz, coupled in series with a first frequency divider 22, a phase detector 24, a loop filter 26, a VCO in the form of a Voltage Controlled-Coaxial Resonator Oscillator (VC-CRO) 28, a coupler 30 that generates a sample of the signal output from the VC-CRO 28, and an amplifier 32 that outputs a signal $S_{OUT}(t)$. Further, the PLL-FS includes a phase feedback path comprising a second frequency divider 36 coupled between the coupler 30 and the phase detector 24.

Within the circuit of FIG. 1, the crystal reference oscillator 20 outputs a crystal reference signal at 8 MHz that is subsequently frequency divided down to 160 KHz by the first frequency divider 22. The phase detector 24 receives the divided crystal reference signal and compares its phase with a feedback signal, the generation of the feedback signal being described herein below. The output of the phase detector 24 is a baseband signal, the amplitude of which is proportional to the phase difference between the two signals input to the phase detector 24, along with comparison frequency spurs at integer multiples of 160 KHz. The loop filter 26 (that could be either passive or active) receives the output from the phase detector 24 and removes the spurs within the signal by rejecting the components at multiples (n×160 KHz) of the comparison frequency (160 KHz), leaving only the baseband signal. This filtered result is fed as a control voltage into a tuning port 34 of the VC-CRO 28, the frequency of which is controlled with a varactor diode arrangement (not shown). The VC-CRO 28 in this case comprises a Colpitts oscillator stabilized with a ceramic coaxial resonator that creates a signal at an oscillation frequency based upon the frequency of resonance of the particular resonator used and the control voltage applied at the tuning port 34. The oscillation frequency is normally slightly less than that of the frequency of resonance (typically between 200 MHz and 5 GHz). The high frequency signal output from the VC-CRO 28 is sampled by the coupler 30 and frequency divided by the second frequency divider 36 to generate the feedback signal input to the phase detector 24. One should understand that the amount the frequency of the feedback signal is divided within the second frequency divider 36 determines the control voltage output from the phase detector 26. This voltage level subsequently determines the oscillation frequency at which the VC-CRO 28 is tuned, with changes in the division factor allowing for step changes in the oscillation frequency. As depicted in FIG. 1, the output from the VC-CRO 28 is received at the amplifier 32 which amplifies the signal and outputs the amplified result as the signal $S_{OUT}(t)$. Overall, the PLL synthesizer architecture enables digital control over the VC-CRO frequency, and also locks the VC-CRO to the reference crystal oscillator which ensures the frequency stability of the source over all system conditions such as temperature, ageing, and mechanical stress.

There are a number of advantages of using a ceramic coaxial resonator to stabilize a VC-CRO within a PLL-FS. These advantages relate to the physical design of a ceramic coaxial resonator. Typically, a ceramic coaxial resonator comprises a ceramic dielectric material formed as a rectangular prism with a coaxial hole running lengthwise through the prism and a electrical connector connected to one end. The outer and inner surfaces of the prism, with the exception of the end connected to the electrical connector and possibly the opposite end, are coated in a metal such as copper or silver. A device formed in this manner essentially forms a resonant RF circuit, including capacitance, inductance, and resistance, that oscillates when in the Transverse Electromagnetic (TEM) mode (as is the case when stabilizing a Colpitts oscillator). The advantages gained with this design include a high Q value (typically approx. 800) and therefore low noise oscillations associated with the resonator as well as temperature stability and resistance to microphonics that characterize a ceramic coaxial resonator. These advantages result in a further important advantage, that being a low cost; currently approximately 65 cents per resonator.

Unfortunately, there is a significant problem with the use of ceramic coaxial resonators as currently designed. The frequency of resonance for a ceramic coaxial resonator has a maximum frequency that can be output due to physical limitations. The frequency of resonance for a ceramic coaxial resonator is based upon the physical size and shape of the particular resonator. Generally, the smaller the size of the resonator, the higher is the frequency of resonance and vice versa. The problem is that ceramic coaxial resonators have a minimum size at which they can be manufactured that limits the frequency of resonance equal to or below a maximum value. This is a physical limit that, as currently designed, limits the output of a typical Coaxial Resonator Oscillator (CRO) using a ceramic coaxial resonator to approximately 5 GHz, whether the CRO is voltage controlled or not.

Up until recently, this 5 GHz limit has not significantly affected the use of ceramic coaxial resonators within VC-CROs or CROs since the frequency of operation of previous communication equipment was typically below this level. For example, PCS equipment operate at approximately 1900 MHz. Currently there are a number of different communication standards that require VCOs with oscillation frequencies higher than 5 GHz. For instance, OC-192 fiber optic signals are transmitted at approximately 10 GHz and the newly developed Local Multipoint Distribution System (LMDS), slated to be used for the Internet over wireless, is set to operate between 28 to 30 GHz. It can be assumed that further developments and standards will be designed that require yet higher oscillation frequencies.

One well-known technique to increase the oscillation frequency of signals within a system using a standard VCO as depicted in FIG. 1 is to use a subharmonically pumped mixer that doubles the oscillation frequency at a stage after the VCO. Unfortunately, even with the use of a subharmonically pumped mixer, a system using the standard VCO that operates with a ceramic coaxial resonator is still limited to a maximum oscillation frequency of 10 GHz which is insufficient for LMDS applications. Hence, techniques are required to increase the oscillation frequency within the actual VCOs.

Figure 2:
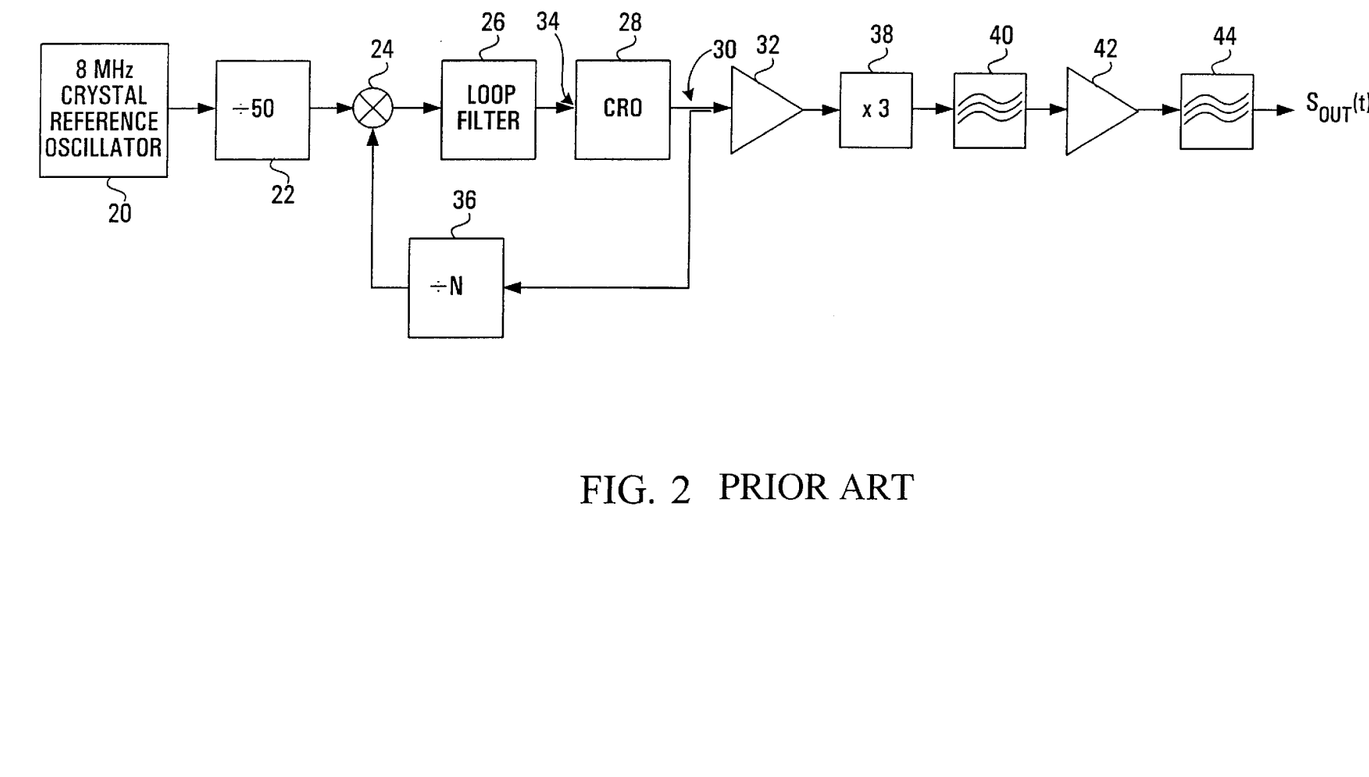
FIG. 2 is a block diagram illustrating the well-known PLL-FS configuration of FIG. 1 with an additional frequency multiplication stage.

One technique that has been tried to increase the oscillation frequency output from a PLL-FS as depicted in FIG. 1 beyond the 5 GHz limit is to add a frequency multiplication stage after the amplifier 32. An example of such a multiplication stage is illustrated within FIG. 2. As can be seen, a frequency multiplier 38 is coupled to the output of the amplifier 32 and further coupled in series with a first filter 40, an amplifier 42, and a second filter 44. In this design, the multiplier 38 increases the oscillation frequency of the signal by three times that of the frequency output from the amplifier 32. Hence, if the original frequency of the VCO was 5 GHz, this would allow the resulting system frequency (after using a subharmonically pumped mixer) to be 30 GHz. The filters 40,44 and amplifier 42 are used to reduce the noise spurs and other undesirable characteristics added to the signal as a result of the multiplier 38. One problem with this implementation is the inability of the filters 40,44 and amplifier 42 to completely remove the spurs and undesired mixing products output from the multiplier 38, hence passing on these non-ideal characteristics to further components within the system that use the oscillating signal. Another problem is the typically low efficiency of multipliers, such as multiplier 38, that can lead to high current consumption within the circuit by the multiplier 38. Yet further, the added components 38,40,42,44 also add to the component count and cost for the overall PLL-FS.

Another technique that is used to increase the oscillation frequency being output from a VCO is to replace the standard VC-CRO 28 with an oscillator stabilized with an alternative resonator device to the ceramic coaxial resonator. In one implementation, this alternate oscillator is a Dielectric Resonator Oscillator (DRO) which can allow for frequencies higher than 20 GHz to be output. A DRO typically continues to use a Colpitts oscillator while using a dielectric resonator in place of the ceramic coaxial resonator. Dielectric resonators consist of a puck of dielectric material encased within a cavity. The physical dimensions of the puck set the frequency range for a DRO while the placement of the puck within the cavity is critical to the tuning of the center frequency. One of the key disadvantages of the DRO implementation is the cost of tuning the center frequency. Since the puck of a DRO is sensitive with respect to its location within the cavity, the DRO as a whole is susceptible to microphonics, that being mechanical vibration of the resonator housing. Although the cost of actual parts used in a DRO are low, the possible problems associated with microphonics and frequency centering adds considerable manufacturing costs to a DRO as specially engineered casings are required. This results in a DRO currently costing approximately $500–600. On the other hand, a well-known CRO as described herein above can cost less than $10.

Another alternative implementation for the VCO within FIG. 1 is to replace the VC-CRO 28 stabilized with a ceramic coaxial resonator with a Yttrium Iron Garnet (YIG) stabilized oscillator. These oscillators can operate at sufficiently high frequencies with low noise throughout the tuning bandwidth. Unfortunately, there are a number of unacceptable disadvantages to their use. For one, the tuning of these YIG devices is relatively slow (300 KHz modulation bandwidth versus a typical 2 MHz modulation bandwidth for a VC-CRO) due to the use of an inductor within the tuning circuit. Other disadvantages include the high current consumption of these oscillators and their relatively high cost when compared to the VC-CRO. A minimum cost for a YIG stabilized oscillator is approximately $90. Due to these problems, YIG stabilized oscillators are used seldom in industry except within measurement equipment.

The advantages of using a ceramic coaxial resonator to stabilize an oscillator within a PLL frequency synthesizer are especially apparent when compared to the alternative designs discussed above. The simple design of a ceramic coaxial resonator is not sensitive to microphonics as there are no placement or cavity requirement, unlike the dielectric resonator implementation. Further, the tuning of a VC-CRO is sufficiently fast to be used within a variety of applications, unlike the tuning of a YIG stabilized oscillator. A key advantage, as a result of the other advantages, is the high performance quality with a low cost. The disadvantage is, as discussed previously, the physical limitation to the size of a ceramic resonator that further causes a limitation to the achievable oscillation frequency. Hence, an alternative implementation for a VCO is required that can satisfy high oscillation frequency requirements while maintaining the advantages gained with the use of ceramic coaxial resonators.

SUMMARY OF THE INVENTION

The present invention, according to one aspect, is a new configuration for an oscillator design that utilizes a single coaxial resonator for two CROs. Typically, these two CROs would utilize two separate coaxial resonators. In this aspect of the present invention, rather than using two separate coaxial resonators, the present invention uses a single coaxial resonator with an electrical connector attached on both ends for coupling the ends to the respective oscillators. This results in the resonator being driven into differential mode, essentially creating a virtual ground in the middle of the resonator between the connectors. With the oscillator design of the present invention, the virtual ground generated in the middle of the resonator effectively divides the resonator device in half, doubling the possible resonance frequency for each half of the resonator. Thus, the range of use for the advantageous ceramic coaxial resonator can be expanded two fold with the use of this invention.

According to a first broad aspect, the present invention is a coaxial resonator. This resonator has opposite ends and two electrical connectors with a first connector projecting from one end and a second connector projecting from the other end. Preferably, the coaxial resonator includes a member of dielectric material that has an inner conductor running in a longitudinal direction from end to end as well as an outer surface that is covered with an outer layer of conductive material.

In preferable embodiments, the coaxial resonator is composed of ceramic material with a hole running from end to end. This hole creates an inner surface that is covered with a layer of conductive material, this layer of conductive material acting as the inner conductor. The electrical connectors are connected to the resonator preferably by attaching the electrical connectors to the layer of conductive material covering the inner surface. This can possibly be done by integrally forming the electrical connectors with the layer of conductive material or by soldering.

The present invention, according to a second broad aspect, is an oscillation circuit that consists of a coaxial resonator and first and second negative resistance cells. These negative resistance cells are coupled on either end of the resonator such that they are designed to be out-of-phase by a phase angle greater than zero degrees. In this broad aspect, the coaxial resonator, in operation, preferably sets an oscillation frequency for both the first and second negative resistance cells to approximately equal to a frequency of resonance associated with another coaxial resonator half the size of the coaxial resonator. Further, the resonator preferably sets the stability of the oscillation frequencies.

In preferred embodiments, these negative resistance cells are balanced and are of the Colpitts type. Also, in some preferable embodiments, oscillation signals, generated by negative resistance cells, are combined to produce an output oscillation signal. In one case in which the phase angle is set to approximately 180°, the output oscillation signal has an oscillation frequency double that of the frequency associated with each of the negative resistance cells.

According to another broad aspect, the present invention is a Phase Locked Loop-Frequency Synthesizer (PLL-FS) that includes the oscillation circuit of the second broad aspect. Preferably, this synthesizer further comprises a crystal resonator, two frequency dividers, a phase detector, one amplifier, and an active or passive loop filter.

The present invention, according to yet another aspect, is a communication apparatus that includes components from one of the other broad aspects, such as the PLL-FS of the third broad aspect. In one embodiment, this communication apparatus operates in accordance with a Local Multipoint Distribution System (LMDS).

Other aspects and features of the present invention will become apparent to those ordinarily skilled in the art upon review of the following description of specific embodiments of the invention in conjunction with the accompanying figures.

BRIEF DESCRIPTION OF THE DRAWINGS

The preferred embodiment of the present invention is described with reference to the following figures, in which.

DETAILED DESCRIPTION OF THE PREFERRED EMBODIMENTS

Preferred embodiments of the present invention are directed to oscillator designs that allow for high oscillation frequencies while continuing to utilize ceramic coaxial resonators to stabilize the oscillators; hence, maintaining the benefits associated with these resonators. These oscillator designs preferably are such that when replacing the well-known VC-CRO 28 within FIG. 1, the PLL-FS of FIG. 1 can be used for high frequency applications such as LMDS applications.

The oscillator designs, according to preferred embodiments, compensate for the minimum size requirement associated with ceramic coaxial resonators by using a single resonator with an electrical connector on either end to stabilize two apparatuses that appear in operation to have negative resistances, hereinafter referred to as negative resistance cells. Essentially, as will be described herein below in detail, this effectively results in a dividing of the ceramic coaxial resonator into two resonators while in operation. Hence, the resonator operates as two resonators half the size of the single resonator, resulting in a doubling of the frequency of resonance when compared to the typical frequency generated with the single ceramic coaxial resonator.

To aid in the explanation concerning the operation of the oscillators according to preferred embodiments, the operation of a typical oscillator with a single negative resistance cell and a single coaxial resonator will first be described in detail with reference to FIG. 3. In this case, the negative resistance cell is in a Colpitts design. Subsequently, a description of an oscillator according to a preferred embodiment of the present invention will be described with reference to FIG. 4.

Figure 3:
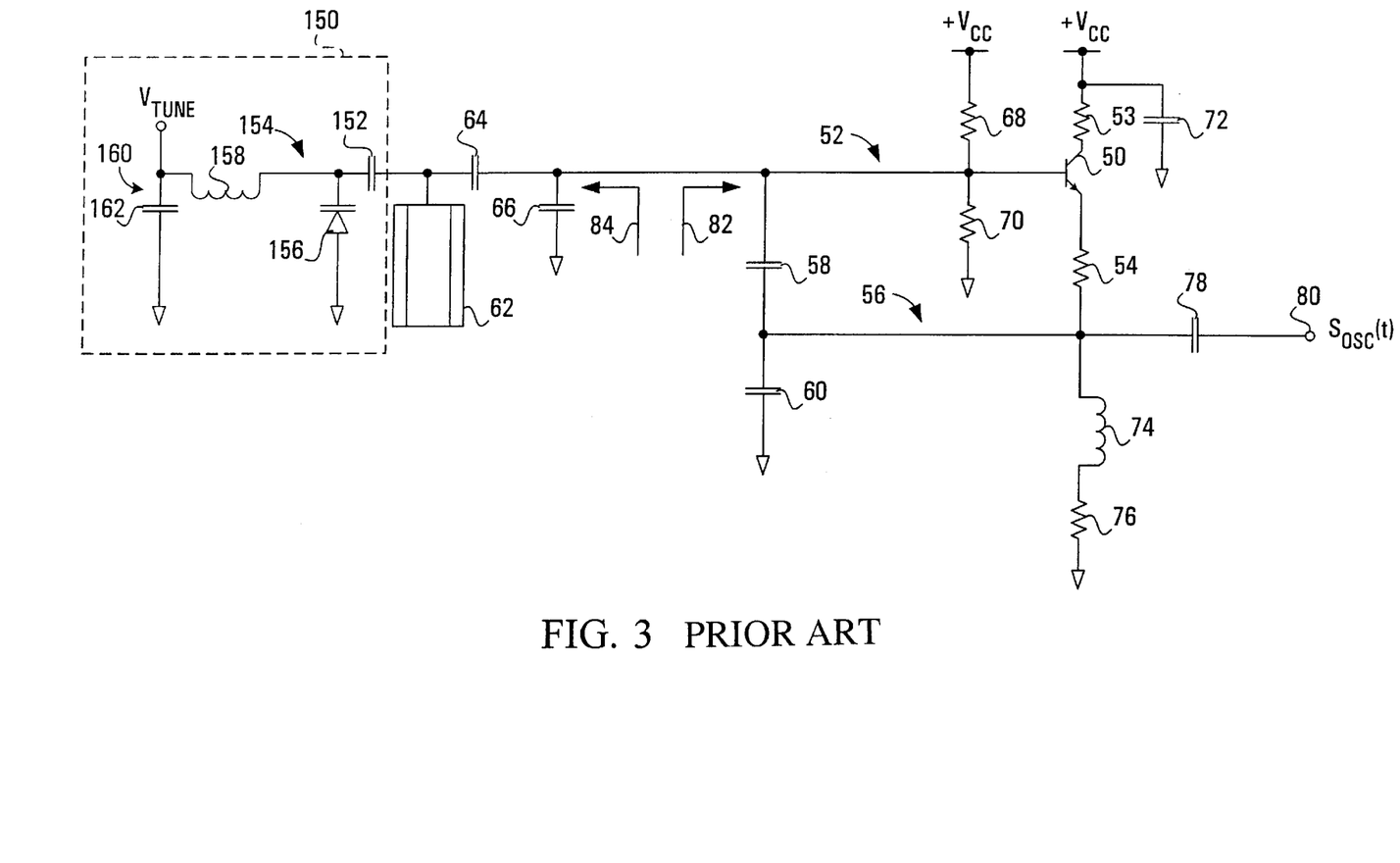
FIG. 3 is a detailed schematic diagram illustrating a well-known Colpitts oscillator using a ceramic coaxial resonator.

FIG. 3 illustrates a schematic diagram of a VC-CRO comprising a negative resistance cell of the Colpitts type that s stabilized with use of a ceramic coaxial resonator. As can be seen within FIG. 3, the VC-CRO comprises a transistor 50 having a collector coupled to a power rail ($V_{CC}$) via an impedance controlling resistor 53, a base coupled to a node 52, and an emitter coupled to a node 56 via a noise suppression resistor 54. The impedance controlling resistor 53 maintains a controlled impedance on the collector of the transistor 50. The noise suppression resistor 54 increases the linearity of the transconductance corresponding to the transistor 50 by reducing the up conversion and baseband flicker noise present in the transistor 50, but also reduces the transistor's gain. Also coupled to the node 56 is a first feedback capacitor 58 coupled between the nodes 52 and 56 and a second feedback capacitor 60 coupled between the node 56 and ground, which together operate to produce a capacitor divider that determines the loop gain for the oscillator. It should be recognized that the transistor 50 and capacitors 58,60 in operation comprise the basic components required within a negative resistance cell of the Colpitts type.

Further included within the negative resistance cell of FIG. 3 is a first biasing resistor 68 coupled between the node 52 and the power rail, a second biasing resistor 70 coupled between the node 52 and ground, a capacitor 72 coupled from the power rail side of resistor 53 to ground, a choke inductor 74 coupled to the node 56, a resistor 76 coupled between the choke inductor 74 and ground, and a coupling capacitor 78 coupled between the node 56 and an output terminal 80 for the circuit. The first and second biasing resistors 68,70 are used to maintain a biasing voltage at the base of the transistor 50. The capacitor 72 operates to ensure the power rail ($V_{CC}$) appears as a short circuit in terms of the RF spectrum. The resistor 76 sets the dc bias level while the choke inductor 74 essentially removes the resistor 76 from the circuit in terms of the RF spectrum. Overall, it should be recognized that the devices 68,70,53,54,72,74,76 aid in the proper operation of the transistor 50 and capacitors 58,60.

Also coupled to the node 52 is a ceramic coaxial resonator 62 and a frequency adjustment apparatus 150, via a coupling capacitor 64, and a phase noise optimization capacitor 66 coupled between the node 52 and ground. The coupling capacitor 64 operates to align the impedance locus of the resonator 62 at resonance with that of the impedance in the remainder of the oscillator. The frequency adjustment apparatus, as described herein below, controls the tuning of the oscillation frequency for the overall circuit.

There are two conditions that must be met for the circuit depicted in FIG. 3 to oscillate. Firstly, the overall loop gain of the feedback path for the transistor 50, comprising capacitors 58,60, resistor 54, the losses corresponding to the resonator 62, and the load on output node 80 must be greater than unity. Secondly, a first reactance looking from arrow 82 must be the complex conjugate of a second reactance looking from arrow 84. This constraint indicates that the reactance resulting from the ceramic coaxial resonator 62 and capacitors 64,66 must be the complex conjugate of the reactance resulting from the transistor 50 and capacitors 58,60 (the negative resistance cell). Since the reactance of these devices changes with frequency, the oscillation frequency will occur when the frequency versus reactance characteristics of the first and second reactances are equal and opposite. Since the reactance of the transistor 50 fluctuates as a function of the transistor noise, the slope of the source frequency versus reactance characteristic for the resonator 62 (this slope representing the Q value for the resonator) should be high in order to reduce the effect the fluctuations of reactance within the transistor 50 have on the oscillation frequency for the overall circuit.

As mentioned previously, the VC-CRO of FIG. 3 includes the frequency adjustment apparatus 150 that is used to adjust the oscillation frequency for the circuit. In the case shown in FIG. 3, the frequency adjustment apparatus 150 comprises a coupling capacitor 152 coupled between the electrical connector of the resonator 62 and a node 154, a varactor diode 156 with its cathode coupled to the node 154 and its anode coupled to ground, a choke inductor 158 coupled between the node 154 and a node 160, and a capacitor 162 coupled between the node 160 and ground. In this setup, if a positive tuning voltage ($V_{TUNE}$) is applied to the node 160, the diode 156 becomes reverse biased. This reverse biasing results in an increase in the depletion region of the device which in turn results in a decrease in the capacitance of the diode 156. Since the varactor diode is coupled to the resonator 62 via the coupling capacitor 152, the adjustment in the capacitance of the diode allows for the regulating of the load on the resonator 62. Overall, by changing the tuning voltage ($V_{TUNE}$), it is possible to adjust the load impedance on the resonator 62 which directly changes the frequency of oscillation.

It is noted that without the frequency adjustment apparatus 150, the VC-CRO of FIG. 3 would not be voltage controlled. It also should be understood that other VC-CRO implementations may use other varactor diode configurations or completely different techniques to adjust the oscillation frequency of the VC-CRO.

As discussed herein above, the oscillation frequency corresponding to the VC-CRO of FIG. 3 is limited to less than or equal to 5 GHz due to physical constraints on the ceramic coaxial resonator 62.

Figure 4A:
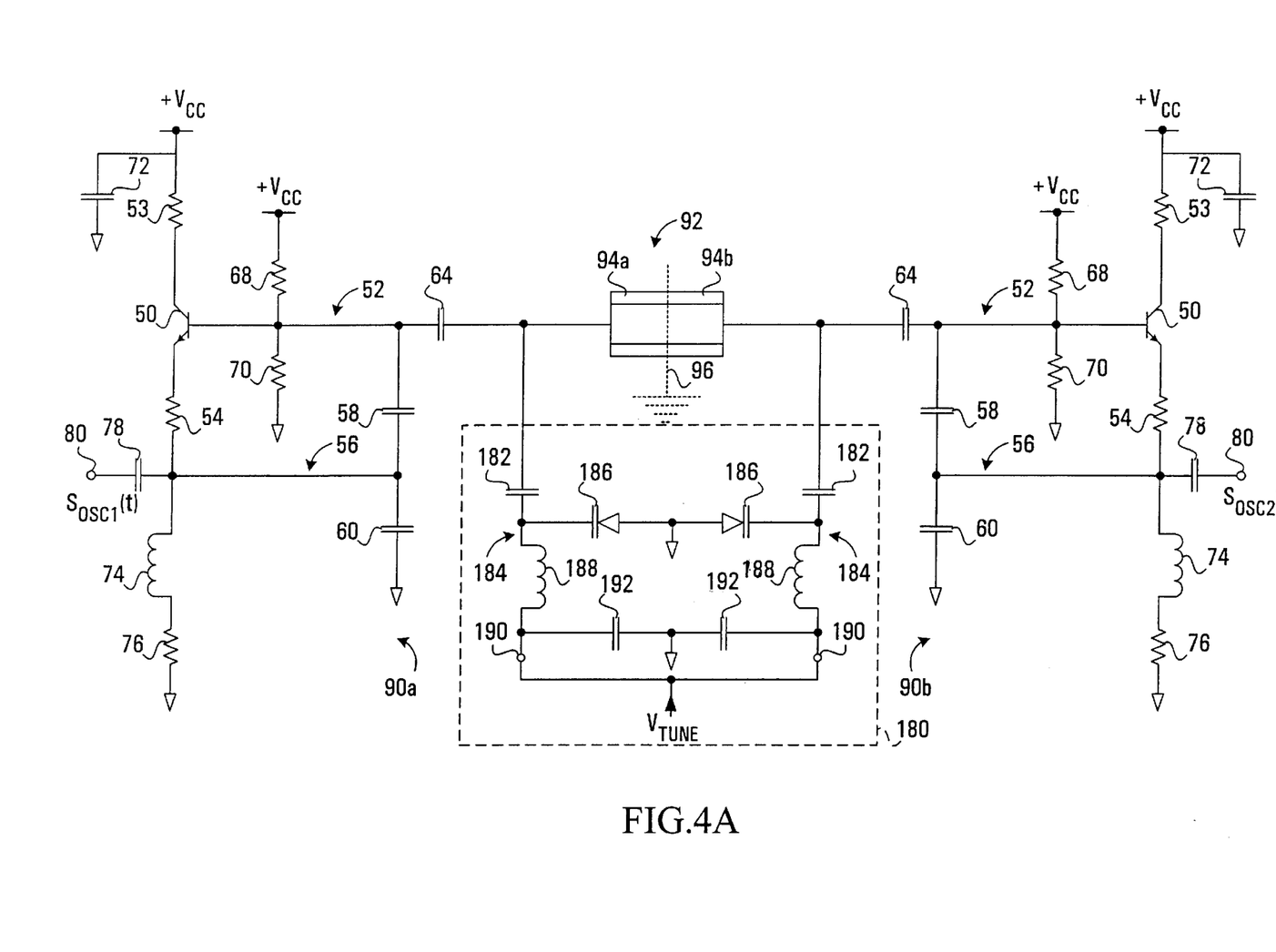
FIG. 4A is a schematic diagram illustrating a balanced oscillator according to a preferred embodiment of the present invention.

FIG. 4A illustrates a schematic diagram of an oscillator design according to a preferred embodiment of the present invention. In this embodiment, the oscillator design comprises first and second negative resistance cells 90a, 90b, in this case each being of the Colpitts oscillator type, that are coupled to electrical connectors at opposite ends of a single coaxial resonator 92, in this case a ceramic coaxial resonator. These first and second negative resistance cells 90a,90b combined with the resonator 92 create first and second oscillators respectively that output first and second oscillation signals $S_{OSC1}(t)$, $S_{OSC2}(t)$.

Each of these negative resistance cells 90a,90b in FIG. 4A is identical to the negative resistance cell depicted in FIG. 3. Effectively, the components within these negative resistance cells operate in similar fashion to those previously described for the well-known negative resistance cell of FIG. 3.

Preferably, the first and second negative resistance cells 90a,90b of FIG. 4A are balanced so that they operate in anti-phase, i.e. operating at the same frequency but approximately 180° out-of-phase. This means that the current traversing node 52 within the first negative resistance cell 90a will be increasing when the current traversing node 52 within the second negative resistance cell 90b is decreasing, and vice versa. This anti-phase operation within the two negative resistance cells results in the ceramic coaxial resonator 92 operating in a differential mode. This differential mode operation effectively divides the resonator 92 into first and second halves 94a,94b by the creation of a virtual ground 96 in the center of the resonator 92.

The division of the ceramic coaxial resonator 92 into two halves 94a,94b during operation reduces the effective length by half of the resonator that is stabilizing each negative resistance cell 90a,90b. Since the physical size of a ceramic coaxial resonator is inversely proportional to the frequency of resonance, the end result is a doubling of the oscillation frequency within the first and second oscillators. Hence, the resulting oscillation signals $S_{OSC1}(t),S_{OSC2}(t)$ at the output terminals 80 of the first and second oscillators respectively have an oscillation frequency approximately twice the frequency of resonance normally achieved with the resonator 92 if implemented within the VC-CRO of FIG. 3.

One modification between the CRO of FIG. 3 and the particular embodiment of the first and second oscillators depicted within FIG. 4 is the removal of capacitor 66. When the oscillation frequency is doubled using the present invention, the loss due to the capacitor 66 will increase. Although this capacitor 66 can increase the Q value for the resonator 92 if coupled between the node 52 and ground, it is not included in the design depicted in FIG. 4A due to the loss that the capacitor creates at high frequencies. Alternatively, a capacitor is included between the node 52 and ground within both the first and second oscillators. The losses due to the capacitors could be deemed acceptable in these alternative embodiments due to the particular design parameters, the characteristics of the devices used, and/or due to the oscillators being operated at lower frequencies.

It is noted that similar to FIG. 3, the first and second oscillators within FIG. 4A are voltage controlled oscillators. As depicted in FIG. 4A, a frequency adjustment apparatus 180 is coupled to both electrical conductors of the resonator 92. This frequency adjustment apparatus 180 preferably consists of two of the frequency adjustment apparatuses 150 depicted within FIG. 3 with a common tuning voltage ($V_{TUNE}$). As depicted in FIG. 4A, the frequency adjustment apparatus 180 comprises, for both halves 94a,94b of the resonator 92, a coupling capacitor 182 coupled between one of the electrical connectors of the resonator 92 and a node 184; a varactor diode 186 with its cathode coupled to the node 184 and its anode coupled to ground; a choke inductor 188 coupled between the node 184 and a node 190; and a decoupling capacitor 192 coupled between the node 190 and ground. The coupling capacitors 182 operate to reduce any losses at the varactor diodes 186 from loading the resonator 92 while the decoupling capacitors 192 operate to decouple the tuning voltage ($V_{TUNE}$) at low frequencies in order to suppress noise on the tuning signal. In this embodiment, similar to that described above for the apparatus 150, a positive tuning voltage ($V_{TUNE}$) will result in both diodes being reverse biased. This in turn will result in an increase in their corresponding depletion regions and a decrease in their capacitance. Hence, the tuning voltage $V_{TUNE}$ can regulate the loading of both sides of the resonator 92 and ultimately control the oscillation frequencies corresponding to the first and second oscillators. In this preferred embodiment of the present invention, the oscillation frequencies for the first and second oscillators track each other since there is a common tuning voltage. In alternative embodiments, other well-known techniques to adjust the frequency of an oscillator with an applied voltage could be utilized within FIG. 4 in place of the frequency adjustment apparatus 180.

Although the output terminals are coupled to the nodes 56, which are low impedance nodes, within the oscillator design depicted within FIG. 4A, it should be recognized that there are other possible output terminal locations. For instance, the outputs of the first and second oscillators could be at the collectors of the transistors 50. Further, the output stage for these oscillators could comprise a cascode implementation as is illustrated within FIG. 4B with cascode apparatuses 220a,220b coupled to the collectors of the transistors 50 within the first and second oscillators respectively. These cascode apparatuses, in this case, each comprise a transistor 222 with a collector coupled to a node 224, a base coupled to a node 226, and an emitter coupled to the collector of the corresponding transistor 50. Within FIG. 4B, the node 224 is further coupled to an output terminal 228 via a coupling capacitor 230 and a choke inductor 232 that is coupled between the node 224 and a node coupled to the power rail and a grounded capacitor 234. The node 226 is further coupled to a first biasing resistor 236 coupled between the power rail and the node 226, a second biasing resistor 238 coupled between the node 226 and ground, and a grounded capacitor 240. Cascode apparatuses, such as the apparatuses 220a,220b within FIG. 4B, are used to provide a low impedance at the collector of their respective transistors 50 as well as boost the signal voltage power of their respective output oscillation signals $S_{OSC1}(t), S_{OSC2}(t)$, in some cases replacing the need for a further amplifying stage.

Figure 4B:
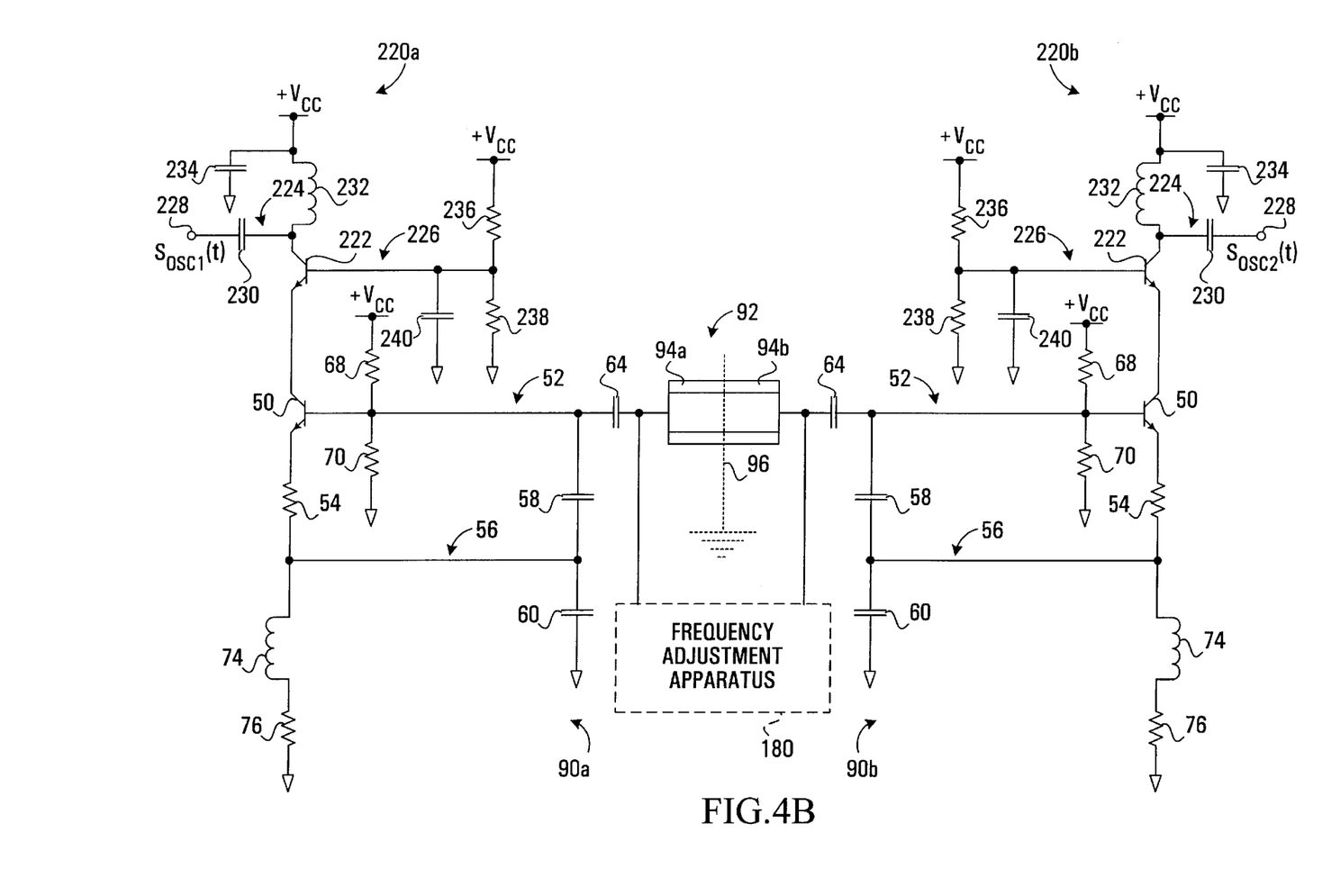
FIG. 4B is the schematic diagram of FIG. 4A with an additional cascode transistor configuration.

It should be understood that the oscillator design depicted in FIG. 4A or 4B could replace the standard VC-CRO depicted in FIG. 3 within the PLL-FS of FIG. 1. This change effectively doubles the oscillation frequency of the PLL-FS without the need for doublers and/or filters. At most the amplifier 32 depicted in FIG. 1 and/or a cascode stage as depicted in FIG. 4B is required to increase the output power level after the VC-CRO of FIG. 4A.

Figure 5A:
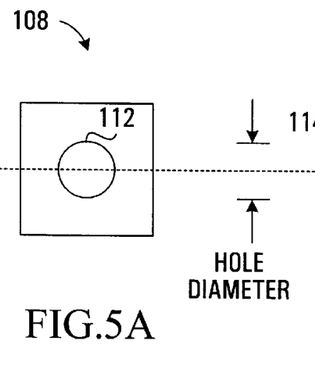
FIGS. 5A and 5B are detailed diagrams illustrating respective cross-sectional and longitudinal views of a ceramic coaxial resonator.
Figure 5B:
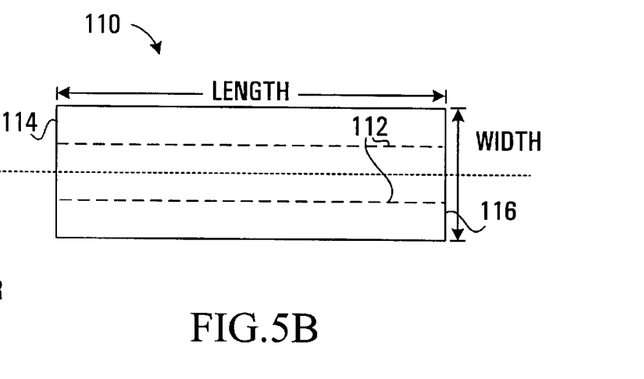
Figure 5C:
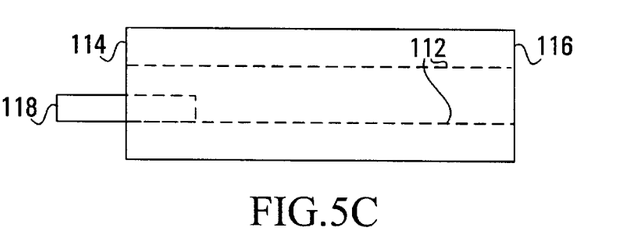
FIGS. 5C and 5D are detailed diagrams illustrating longitudinal views of the ceramic resonator of FIGS. 5A and 5B with respectively a well-known single connector configuration and a double connector configuration according to a preferred embodiment of the present invention.

FIGS. 5A and 5B illustrate cross-sectional and longitudinal views 108,110 respectively of a typical ceramic coaxial resonator with no electrical connectors attached. The resonator depicted in FIGS. 5A and 5B is a rectangular prism of ceramic dielectric material with a hole 112, in this case a circular hole, running longitudinally through it. This resonator includes first and second ends 114,116 in which the openings of the hole 112 are located, as well as four other outside longitudinal surfaces. FIG. 5C illustrates a longitudinal view of the resonator of FIG. 5A with a first electrical connector 118 attached to the inside surface of the hole 112 at the first end 114. This resonator is typical for implementation as the resonator 62 within FIG. 3. For this implementation, the longitudinal outside surfaces, the inside surfaces of the hole 112, and possibly the second end 116 would have a layer of conductive material added, normally the conductive material being a metal such as copper or silver. The first electrical connector 118 could preferably be attached to the ceramic dielectric material via the conductive material layer on the inside surface of the hole 112 near the first end 114.

Figure 5D:
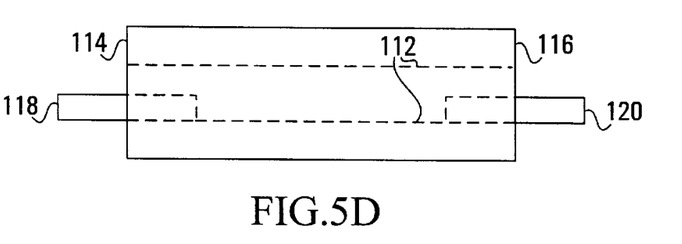

A modification, according to preferred embodiments of the present invention as depicted in FIG. 5D, that is made to a standard ceramic coaxial resonator, such as the resonator 62 within FIG. 3, is the addition of a second electrical connector 120 at the second end surface 116. The first and second electrical connectors 118,120 are necessary to connect the resonator 92 to the capacitors 64 within the respective first and second oscillators of FIGS. 4A and 4B. This second electrical connector 120 is preferably connected to the ceramic dielectric material in a similar manner as the first electrical connector 118 but via the conductive material layer on the inside surface of the hole 112 near the second end 116. Alternatively, another technique is used to attach the first and/or second electrical connectors such as soldering. It is noted that electrical connectors could be conductive tabs or further another component that makes it possible for the resonator 92 to be part of an oscillator on either end 114,116.

Although the ceramic coaxial resonator depicted within FIGS. 5A through 5D is in the shape of a rectangular prism and the hole 112 is depicted as circular, these characteristics are not meant to limit the scope of the present invention. The resonator can be of a different shape that still properly resonates as long as the opposite ends of the resonator are capable of being coupled to negative resistance cells. For instance, the resonator could be a cylindrical prism and/or have no hole but simply a conductive link between the opposite ends of the resonator. Yet further, the use of ceramic dielectric material within the coaxial resonator is not meant to limit the scope of the present invention. Another dielectric material could replace the ceramic material, though currently ceramic material is preferred due to the better performance characteristics.

Figure 6:
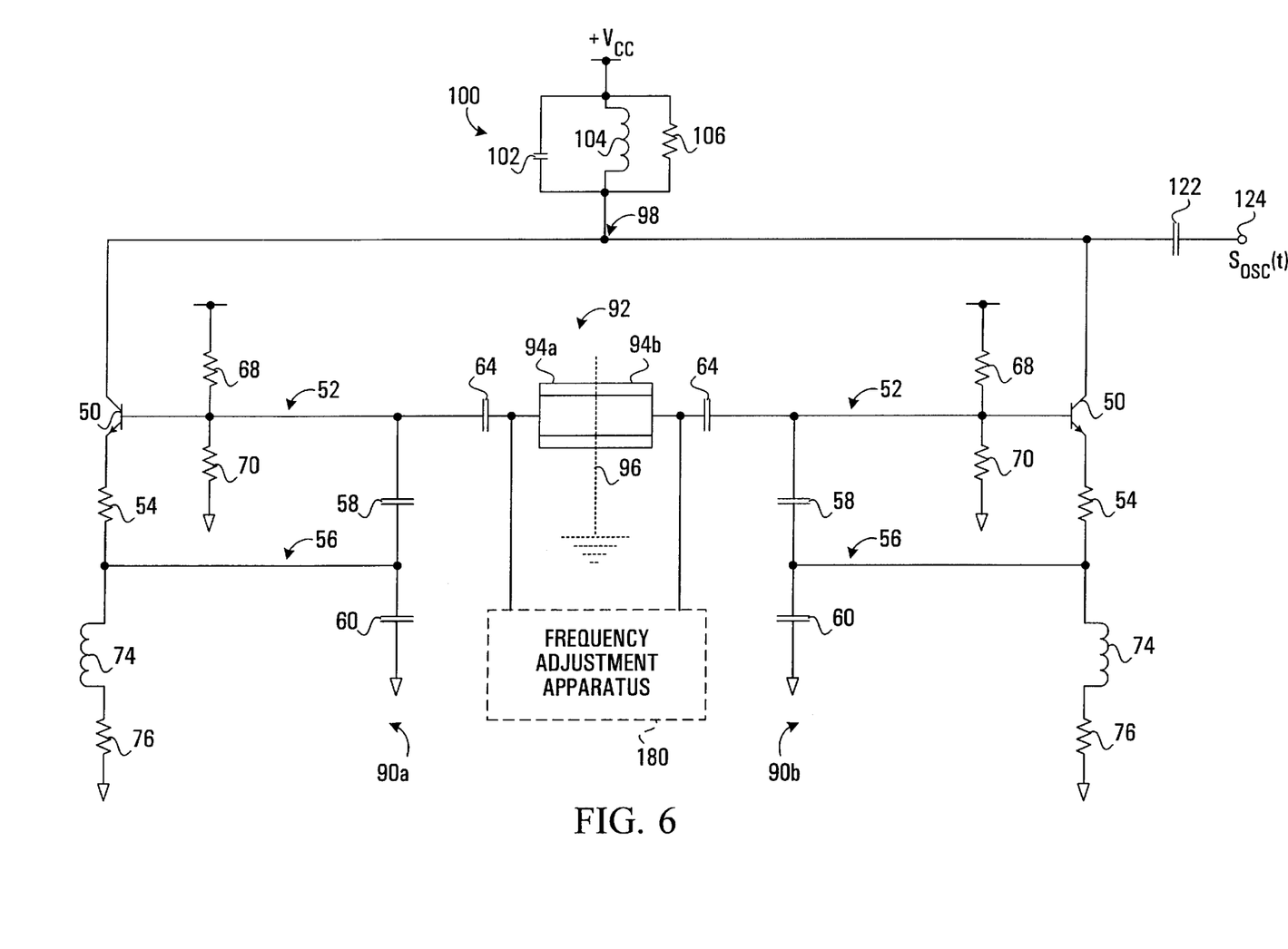
FIG. 6 is a schematic diagram illustrating a push-push oscillator according to a preferred embodiment of the present invention.

An oscillator design according to another preferred embodiment of the present invention is depicted within FIG. 6. This design comprises two balanced negative resistance cells 90a,90b, similar to those described herein above for the preferred embodiment depicted in FIG. 4, these cells operating with the resonator 92 as first and second oscillators that are out-of-phase by approximately 180°. The key difference between the embodiments of FIGS. 4 and 6 is the outputting of the oscillation signals from the overall oscillator. As can be seen in FIG. 6, the resistors 53, capacitors 72, coupling capacitors 78, and outputting terminals 80 have been removed within the balanced negative resistance cells 90a, 90b. In place of these devices, the collectors corresponding to the transistors 50 within FIG. 6 have been coupled together at a node 98 and further coupled to a tuned circuit 100 and an output terminal 124 via a coupling capacitor 122.

The tuned circuit 100 preferably comprises a capacitor 102, an inductor 104, and a resistor 106 coupled in parallel between the power rail and the node 98. This tuned circuit 100 is tuned to the second harmonic frequency of the oscillators, that being twice the oscillation frequency corresponding to the first and second oscillators in order to suppress the fundamental frequency and select out the second harmonic. Although, in FIG. 6, the tuned circuit 100 comprises a number of devices in parallel, this should not limit the scope of the present invention. Alternatively, other circuits that have a specific tuned frequency could be utilized such as a single inductor or a quarter wave resonant line.

Figure 7A:
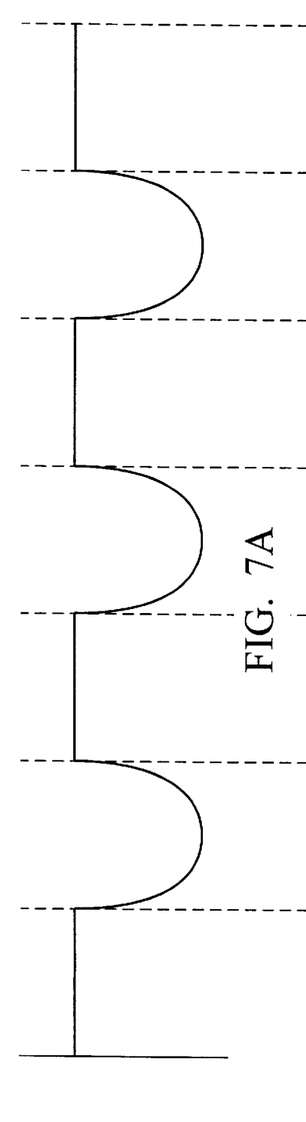
FIGS. 7A and 7B are graphical illustrations of possible voltage waveforms generated by the transistors within the first and second negative resistance cells of FIG. 6.
Figure 7B:
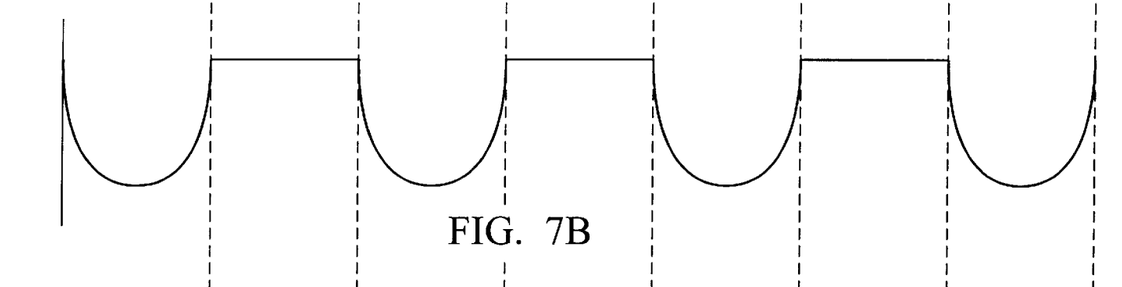
Figure 7C:
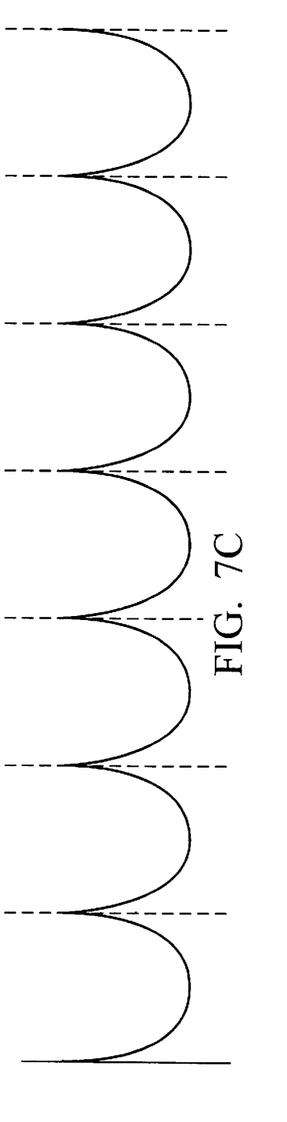
FIG. 7C is a graphical illustration of a possible voltage waveform combining the waveforms depicted in FIGS. 7A and 7B, that drives the tuned circuit of FIG. 6.

Effectively, the single output at the output terminal 124 of FIG. 6 is a combination of the oscillation signals from the first and second oscillators that are out-of-phase by approximately 180°. FIGS. 7A and 7B illustrate graphical depictions of possible voltage waveforms generated by transistors 50 within the first and second negative resistance cells 90a,90b respectively. Further, FIG. 7C depicts a possible voltage waveform combination of the waveforms depicted in FIGS. 7A and 7B, this combined waveform driving the tuned circuit 100 within FIG. 6. As can be seen in FIGS. 7A and 7B, the waveforms generated by the transistors 50 are clipped sinusoidal signals that are out-of-phase by 180°. The clipping in these signals can be due to the transistors 50 going into compression as the signal voltage is limited by a power rail or due to the transistors 50 being shut off for a period of time as the transistors are limited through cutoff. The result of a combination of the voltage waveforms shown in FIGS. 7A and 7B, as depicted within FIG. 7C, is a voltage waveform with an overall oscillation frequency double that of each of the first and second oscillators. This type of circuit, in which two balanced oscillators generate two anti-phase clipped signals at a first frequency and combine the clipped signals to generate a signal at a second frequency twice the value of the first frequency, is known as a push-push oscillator. As depicted within FIG. 6, the use of the present invention within a push-push oscillator design can allow for a quadrupling of the resulting oscillation frequency when compared to the frequency of resonance that would be achieved using the resonator 92 within the oscillator of FIG. 3.

A key advantage of the present invention is the possibility of increasing an oscillation frequency beyond the physical limitation commonly thought for a ceramic coaxial resonator while still utilizing a ceramic coaxial resonator. If utilized within a push-push oscillation design and the system further has a subharmonically pumped mixer for doubling the frequency, the present invention can increase the range of use for a VC-CRO from approximately 20 GHz (5×2×2) to approximately 40 GHz (5×2×2×2). This expansion in frequency allows high frequency applications such as LMDS applications to achieve the required frequency while still using the advantageous ceramic coaxial resonators. All of the advantages of the ceramic coaxial resonators as described herein above are advantages of the present invention, especially when considering applications requiring frequencies higher than 20 GHz. In terms of the LMDS applications, the DRO at a present cost of approximately $500–600 can be replaced with a push-push oscillator as depicted in FIG. 6 at a cost less than $10, assuming a subharmonically pumped mixer or doubler is implemented within the system.

It should be understood that although the present invention can be utilized by a system using a ceramic coaxial resonator to raise the oscillation frequency to levels above 20 GHz, the present invention can also be utilized in implementations requiring lower frequencies. The present invention does not have to be operated with the minimum size ceramic coaxial resonator or with any other frequency doubling techniques. There are possible advantages of the present invention even at these lower frequencies when compared to other oscillator designs. For instance, there are advantages to using one large resonator within the push-push oscillator design as depicted in FIG. 6 rather than using two resonators half the size within or using a single resonator a quarter the size within a standard CRO as depicted in FIG. 3. For one, the resonator Q factor can be increased by using a physically larger sized resonator that can store an increased amount of energy. When using a single large resonator in the push-push architecture of a preferred embodiment of the present invention and then using the technique discussed above to double the frequency to the level of interest, the Q level for the resonator improves and the phase noise can subsequently be reduced. Secondly, a current disadvantage with balanced or push-push oscillator design that use two resonators is that a shared isolated ground plane is required to allow for a floating ground for the resonators to be generated during operation. The need for the isolated ground plane is a disadvantage the preferred embodiments of the present invention depicted within FIGS. 4 and 6 do not have since the virtual ground is within the resonator itself for these embodiments. Further, the lack of an isolated ground plane allows the outside of the resonator according to preferred embodiments of the present invention to be grounded which increases its ability to be manufactured.

Although the negative resistance cells 90a,90b have been described for the preferred embodiments herein above as being balanced with the result being oscillation signals out-of-phase by 180°, this is not meant to limit the scope of the present invention. The present invention could be implemented within embodiments in which the negative resistance cells are balanced but not 180° out-of-phase, but instead are out-of-phase by more or less degrees, generally stated as being out-of-phase by a phase angle greater than zero. For instance, an oscillator design, according to an alternative embodiment of the present invention that does not have resonators out-of-phase at 180°, comprises four resonators coupled in a ring configuration with each end of a resonator coupled to the end of another one of the resonators. Further, the resonators are each in parallel with an amplifier that can operate as a negative resistance cell. In this case, four oscillation signals are generated, one between each pair of resonators, with a 90° difference between each. When these signals are combined, an oscillating signal is generated at an oscillation frequency four times the frequency of resonance for one of the utilized resonators if implemented within the VC-CRO of FIG. 3.

Further, despite the preferred embodiments being directed to balanced oscillator embodiments, there are possible advantages to having embodiments of the present invention in which the two negative resistance cells are not balanced. Currently unbalanced oscillator designs utilizing the present invention are being studied by the applicant of the present invention. There currently appear to be possible advantages of having one negative resistance cell tuned to a frequency higher than the other negative resistance cell such that the virtual ground 96 is not at the center of the resonator 92. The moving of the virtual ground 96 could possibly allow for the effective dividing of a ceramic coaxial resonator into smaller portions than halves, thus extending the potential frequency of operation of a ceramic coaxial resonator.

Figure 8:
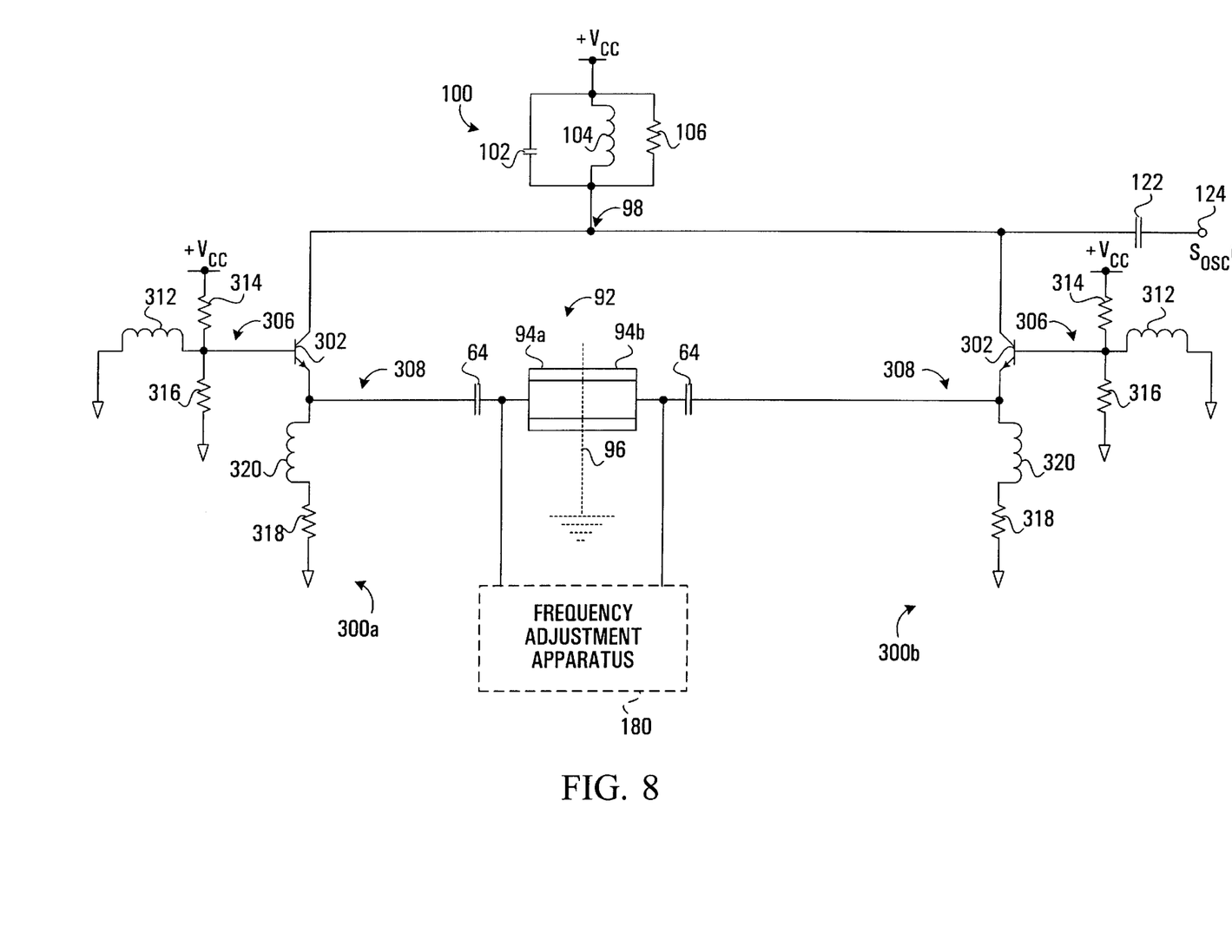
FIG. 8 is a schematic diagram illustrating a push-push oscillator according to an alternative embodiment of the present invention.

Yet further, although the preferred embodiment of the present invention is described with respect to negative resistance cells of a Colpitts type, this is not meant to limit the present invention. There are many well-known apparatuses that function as negative resistance cells in operation that can be coupled to either side of a coaxial resonator to generate an oscillator that utilizes the present invention. For example, FIG. 8 illustrates the push-push architecture of FIG. 6 with the negative resistance cells of the Colpitts type replaced with alternative negative resistance cells 300a, 300b. In this case, each of the negative resistance cells 300a,300b comprise a transistor 302 with a collector coupled to the node 98 (and further coupled to the other collector), a base coupled to a node 306 and an emitter coupled to a node 308. The nodes 308 are each further coupled to a respective end of the resonator 92 via coupling capacitor 64. The nodes 306 are each further coupled to an inductor 312 coupled between the node 306 and ground, a first biasing resistor 314 coupled between the node 306 and the power rail, and a second biasing resistor 316 coupled between the node 306 and ground. The emitter biasing in these negative resistance cells 300a,300b is achieved through respective resistors 318 which are isolated from the RF circuit by respective choke inductors 320 in series. The remaining components depicted in FIG. 8 have previously been described herein above with reference to other embodiments. The overall operation of the push-push oscillator depicted in FIG. 8 is similar to the design of FIG. 6 but with a different configuration for the balanced negative resistance cells. The end result is similar, that being a quadrupling of the oscillation frequency at the output terminal 124 compared to the traditional frequency of resonance for the resonator 92 when in a setup as depicted in FIG. 3.

The preferred embodiments of the present invention were described as VC-CROs. It should be recognized that with the removal of the frequency adjustment apparatus 180, the oscillators are simply CROs with no voltage control.

Although the oscillator circuits of the present invention described herein above are operating at the fundamental mode of the resonator, the circuits could alternatively be designed to sustain oscillations at higher order modes of the resonator.

Persons skilled in the art will appreciate that there are yet more alternative implementations and modifications possible for implementing the present invention, and that the above implementation is only an illustration of this embodiment of the invention. The scope of the invention, therefore, is only to be limited by the claims appended hereto.

We claim:

1. An oscillation circuit comprising a coaxial resonator having opposite ends and two electrical connectors, a first one projecting from one end and a second one projecting from another one and first and second negative resistance cells electrically coupled respectively to the first and second electrical connectors.

2. An oscillation circuit comprising:
 a coaxial resonator with first and second electrical connectors coupled at respective first and second opposite ends of the coaxial resonator; and
 first and second negative resistance cells, coupled to the first and second electrical connectors respectively, that are out-of-phase by a phase angle greater than zero degrees.

3. An oscillation circuit according to claim 2, wherein the coaxial resonator, in operation, sets an oscillation frequency for both the first and second negative resistance cells to approximately equal to a frequency of resonance associated with another coaxial resonator half the size of the coaxial resonator and further sets the stability of the oscillation frequencies.

4. An oscillation circuit according to claim 3, wherein the first and second negative resistance cells generate first and second oscillation signals that are at the set oscillation frequency but out-of-phase by the phase angle; and
 wherein the first and second oscillation signals are combined within the oscillation circuit to produce an output oscillation signal.

5. An oscillation circuit according to claim 4, wherein the first and second negative resistance cells are balanced such that the phase angle is set to be approximately 180°;
 whereby the output oscillation signal has an oscillation frequency double that of the set oscillation frequency.

6. An oscillation circuit according to claim 3, wherein the first and second negative resistance cells are of a Colpitts type.

7. An oscillation circuit according to claim 6, wherein the first and second negative resistance cells each comprise a transistor with a base, emitter and collector, a first feedback capacitor coupled between the base and emitter, and a second capacitor coupled between the emitter and ground, the bases of the transistors each further being coupled to a respective electrical connector of the coaxial resonator and the collectors each being coupled to a power rail.

8. An oscillation circuit according to claim 7, wherein the first and second negative resistance cells generate respective first and second output oscillation signals that are at a common frequency but out-of-phase by the phase angle, these output oscillation signals arranged to be output from the respective negative resistance cells from an output node coupled to the emitter of the respective transistors.

9. An oscillation circuit according to claim 8 further comprising a cascode stage coupled to the output terminals that increases the voltage of the output oscillation signals.

10. An oscillation circuit according to claim 7, wherein the first and second negative resistance cells generate respective first and second output oscillation signals that are at a common frequency but out-of-phase by the phase angle, these output oscillation signals arranged to be output from the respective negative resistance cells from an output node coupled to the collector of the respective transistors, the collectors being coupled to the power rail via the node and a collector resistor.

11. An oscillation circuit according to claim 10 further comprising a cascode stage coupled to the output terminals that increases the voltage of the output oscillation signals.

12. An oscillation circuit according to claim 7, wherein the first and second feedback capacitors within each negative resistance cell are coupled to the respective emitter via an emitter resistor;
 wherein each of the negative resistance cells further comprises a first biasing resistor coupled between the power rail and its respective base, a second biasing resistor coupled between ground and its respective base, and a dc bias resistor coupled in series with a choke inductor, the dc bias resistor and the choke inductor further coupled between their respective emitter and ground; and wherein the first and second biasing resistors operate to generate biasing voltages at their respective bases, the dc bias resistors operate to generate dc bias voltages at their respective emitters, and the choke inductors operate to open circuit their respective dc bias resistors within an RF spectrum.

13. An oscillation circuit according to claim 6, wherein the first and second negative resistance cells each comprise a transistor with a base, an emitter and a collector, a first feedback capacitor coupled between the base and emitter, and a second capacitor coupled between the emitter and ground, the bases of the transistors further being coupled to a respective electrical connector of the coaxial resonator;

wherein the collectors of the transistors are coupled together at a common node, the common node further being coupled to a tuning circuit that is tuned to the second harmonic of the oscillation frequency corresponding to both the negative resistance cells and further being coupled to an output terminal that is arranged to output an output oscillation signal.

14. An oscillation circuit according to claim 13 further comprising a cascode stage coupled to the output terminal that increases the voltage of the output oscillation signal.

15. An oscillation circuit according to claim 13, wherein the negative resistance cells are balanced such that the phase angle is set to be approximately 180°; and whereby the output oscillation signal has an oscillation frequency double that of the set oscillation frequency.

16. An oscillation circuit according to claim 13, wherein the first and second feedback capacitors within each negative resistance cell are coupled to the respective emitter via an emitter resistor;

wherein each of the negative resistance cells further comprises a first biasing resistor coupled between a power rail and its respective base, a second biasing resistor coupled between ground and its respective base, and a dc bias resistor coupled in series with a choke inductor, the dc bias resistor and the choke inductor further coupled between their respective emitter and ground; and wherein the first and second biasing resistors operate to generate biasing voltages at their respective bases, the dc bias resistors operate to generate dc bias voltages at their respective emitters, and the choke inductors operate to open circuit their respective dc bias resistors within an RF spectrum.

17. An oscillator according to claim 3, wherein the first and second negative resistance cells each comprise a transistor with a base, an emitter and a collector, and an inductor coupled between the base and ground, the emitters of the transistors further being coupled to a respective electrical connector of the coaxial resonator; and wherein the collectors of the transistors are coupled together at a common node, the common node further being coupled to a tuning circuit that is tuned to the second harmonic of the oscillation frequency corresponding to both the negative resistance cells and further being coupled to an output terminal that is arranged to output an output oscillation signal.

18. An oscillation circuit according to claim 17, wherein each of the negative resistance cells further comprises a first biasing resistor coupled between the power rail and its respective base, a second biasing resistor coupled between ground and its respective base, and a dc bias resistor coupled in series with a choke inductor, the dc bias resistor and the choke inductor further coupled between their respective emitter and ground; and wherein the first and second biasing resistors operate to generate biasing voltages at their respective bases, the dc bias resistors operate to generate dc bias voltages at their respective emitters, and the choke inductors operate to open circuit their respective dc bias resistors within an RF spectrum.

19. An oscillator according to claim 3, wherein the first and second negative resistance cells each comprise a transistor with a base, an emitter and a collector, and an inductor coupled between the base and ground, the emitters of the transistors further being coupled to a respective electrical connector of the coaxial resonator; and wherein the collectors of the transistors are each coupled to a power rail via a collector resistor and to an output terminal via a coupling capacitor.

20. An oscillation circuit according to claim 19, wherein each of the negative resistance cells further comprises a first biasing resistor coupled between the power rail and its respective base, a second biasing resistor coupled between ground and its respective base, and a dc bias resistor coupled in series with a choke inductor, the dc bias resistor and the choke inductor further coupled between their respective emitter and ground; and wherein the first and second biasing resistors operate to generate biasing voltages at their respective bases, the dc bias resistors operate to generate dc bias voltages at their respective emitters, and the choke inductors operate to open circuit their respective dc bias resistors within an RF spectrum.

21. An oscillation circuit according to claim 2, wherein the first and second electrical connectors of the coaxial resonator are coupled to the respective negative resistance cells via coupling capacitors.

22. An oscillation circuit according to claim 2, wherein the phase angle is set to be approximately 180°.

23. An oscillation circuit according to claim 2, wherein the first and second electrical connectors of the coaxial resonator are coupled to a frequency adjustment apparatus that in operation receives a tuning voltage and adjusts the load being applied to the coaxial resonator.

24. An oscillation circuit according to claim 23, wherein the frequency adjustment apparatus operates with use of a varactor diode.

25. A Phase Locked Loop-Frequency Synthesizer (PLL-FS), incorporating an oscillation circuit according to claim 2, comprising:

a crystal resonant oscillator that generates a first oscillation signal at a first frequency;

a first frequency divider, coupled to the crystal resonant oscillator that receives the first oscillation signal and reduces its frequency to a second frequency lower than the first frequency;

a phase detector, coupled to the first frequency divider, that receives the first oscillation signal and a feedback oscillation signal and compares the phase of the received signals to generate an error signal;

a loop filter, coupled to the phase detector, that receives the error signal and filters it to remove components generated during the comparison, leaving only the baseband signal within a filtered signal;

the oscillation circuit, coupled to the loop filter, that receives the filtered signal and generates a second oscillation signal with a predetermined phase at a third frequency higher than the first frequency; and a second frequency divider, coupled between the oscillation circuit and the phase detector, that receives the second oscillation signal and reduces its frequency to a fourth frequency to generate the feedback oscillation signal.

26. A PLL-FS according to claim 25 further comprising an amplifier, coupled to the oscillation circuit, that receives the second oscillation signal and amplifies it to generate an output signal for the PLL-FS.

27. A PLL-FS according to claim 25, wherein the oscillation circuit further comprises a cascode stage that amplifies the second oscillation signal prior to the second oscillation signal being output.

28. A communication apparatus incorporating the PLL-FS of claim 25.

29. A coaxial resonator having opposite ends, the resonator arranged to create a Transverse Electromagnetic (TEM) mode wave at both the ends simultaneously such that the resonator is effectively divided into two portions by a virtual ground formed in operation.

* * * * *